United States Patent
Jung et al.

(10) Patent No.: US 9,711,573 B2
(45) Date of Patent: Jul. 18, 2017

(54) ORGANIC LIGHT-EMITTING DISPLAY APPARATUS

(71) Applicant: Samsung Display Co., Ltd., Yongin-si (KR)

(72) Inventors: Sungwoo Jung, Yongin-si (KR); Sangshin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/978,922

(22) Filed: Dec. 22, 2015

(65) Prior Publication Data
US 2016/0322436 A1 Nov. 3, 2016

(30) Foreign Application Priority Data
Apr. 30, 2015 (KR) .................. 10-2015-0062022

(51) Int. Cl.
*H01L 27/32* (2006.01)
*H01L 51/50* (2006.01)
*H01L 51/52* (2006.01)

(52) U.S. Cl.
CPC ........ *H01L 27/3246* (2013.01); *H01L 27/326* (2013.01); *H01L 27/3262* (2013.01); *H01L 51/50* (2013.01); *H01L 51/5203* (2013.01)

(58) Field of Classification Search
CPC ............. H01L 27/3246; H01L 27/3248; H01L 27/326; H01L 27/3262; H01L 51/50
See application file for complete search history.

(56) References Cited

U.S. PATENT DOCUMENTS

| 2009/0200936 A1* | 8/2009 | Kang ................. H01L 51/5203 313/505 |
| 2009/0309108 A1 | 12/2009 | Chang et al. |
| 2010/0148192 A1 | 6/2010 | Jung et al. |
| 2010/0237772 A1 | 9/2010 | Sakai et al. |
| 2010/0238096 A1* | 9/2010 | Jeon .................... H01L 27/3218 345/83 |
| 2011/0291550 A1 | 12/2011 | Kim et al. |

(Continued)

FOREIGN PATENT DOCUMENTS

| KR | 10-2006-0055098 | 5/2006 |
| KR | 10-2009-0128884 | 12/2009 |

(Continued)

OTHER PUBLICATIONS

Extended European Search Report issued on Oct. 5, 2016, in European Patent Application No. 16160558.9.

*Primary Examiner* — Allan R Wilson
(74) *Attorney, Agent, or Firm* — H.C. Park & Associates, PLC

(57) ABSTRACT

An organic light-emitting display apparatus includes a first pixel electrode and a second pixel electrode that are disposed spaced apart adjacent to each other; and a pixel-defining layer disposed on the first pixel electrode and the second pixel electrode, the pixel-defining layer covering a part of the first pixel electrode and a part of the second pixel electrode except a center portion of the first pixel electrode, a center portion of the second pixel electrode, a first edge of the first pixel electrode in a direction to the second pixel electrode, and a second edge of the second pixel electrode in a direction to the first pixel electrode.

14 Claims, 3 Drawing Sheets

(56) References Cited

U.S. PATENT DOCUMENTS

| | | | |
|---|---|---|---|
| 2014/0197385 A1 | 7/2014 | Madigan | |
| 2015/0054719 A1* | 2/2015 | Lee | G09G 3/3208 345/76 |
| 2016/0043150 A1* | 2/2016 | Wang | H01L 27/3246 257/40 |
| 2016/0163770 A1* | 6/2016 | Kim | H01L 27/326 257/40 |

FOREIGN PATENT DOCUMENTS

| | | |
|---|---|---|
| KR | 10-2010-0067463 | 6/2010 |
| KR | 10-2011-0129531 | 12/2011 |

* cited by examiner

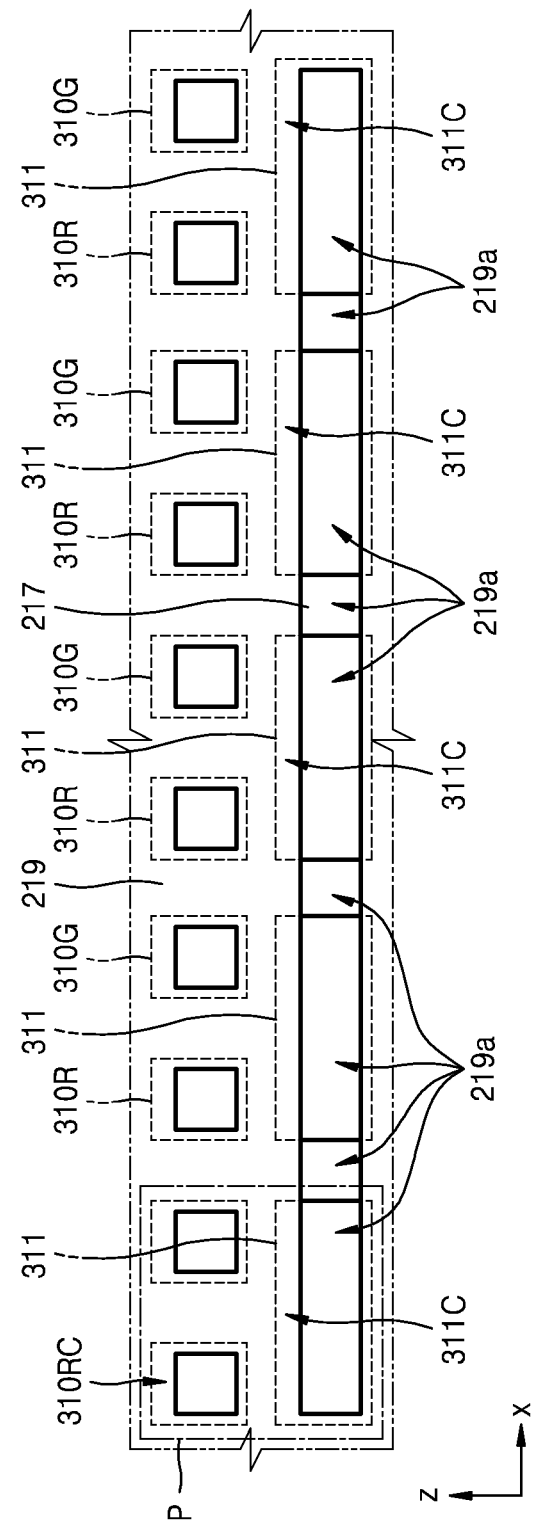

ORGANIC LIGHT-EMITTING DISPLAY APPARATUS

CROSS-REFERENCE TO RELATED APPLICATION

This application claims priority from and the benefit of Korean Patent Application No. 10-2015-0062022, filed on Apr. 30, 2015, which is hereby incorporated by reference for all purposes as if fully set forth herein.

BACKGROUND

Field

Exemplary embodiments relate to an organic light-emitting display apparatus capable of displaying images precisely while improving the brightness of the organic light-emitting display apparatus.

Discussion of the Background

In general, an organic light-emitting display apparatus is a display apparatus displaying images by using light emitted from an emission layer disposed between a pixel electrode and an opposite electrode. The organic light-emitting display apparatus conventionally includes a pixel electrode electrically connected to a thin film transistor, and an electric signal is applied to the pixel electrode via the thin film transistor to control light emission in each sub-pixel or a light-emitting degree.

The organic light-emitting display apparatus may have reduced sizes of sub-pixels for high resolution, and accordingly, the light emitted from the sub-pixels may have reduced brightness.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments include an organic light-emitting display apparatus capable of displaying images precisely while improving the brightness of the organic light-emitting display apparatus.

Additional aspects will be set forth in the detailed description which follows, and, in part, will be apparent from the disclosure, or may be learned by practice of the inventive concept.

An exemplary embodiment provides an organic light-emitting display apparatus including: a first pixel electrode and a second pixel electrode that are disposed spaced apart adjacent to each other; and a pixel-defining layer disposed on the first pixel electrode and the second pixel electrode, the pixel-defining layer covering a part of the first pixel electrode and a part of the second pixel electrode except a center portion of the first pixel electrode, a center portion of the second pixel electrode, a first edge of the first pixel electrode in a direction to the second pixel electrode, and a second edge of the second pixel electrode in a direction to the first pixel electrode.

An exemplary embodiment provides an organic light-emitting display apparatus including: a plurality of pixel electrodes arranged in a row, each of the plurality of pixel electrodes being disposed to be spaced apart from with each other; and a pixel-defining layer disposed on the plurality of pixel electrodes, the pixel defining layer covering parts of the plurality of pixel electrodes except center portions of the plurality of pixel electrodes and edges between adjacent ones of the plurality of pixel electrodes.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 3 is a plan view of a part of an organic light-emitting display apparatus according to an exemplary embodiment.

DETAILED DESCRIPTION OF THE ILLUSTRATED EMBODIMENTS

Figure 1:
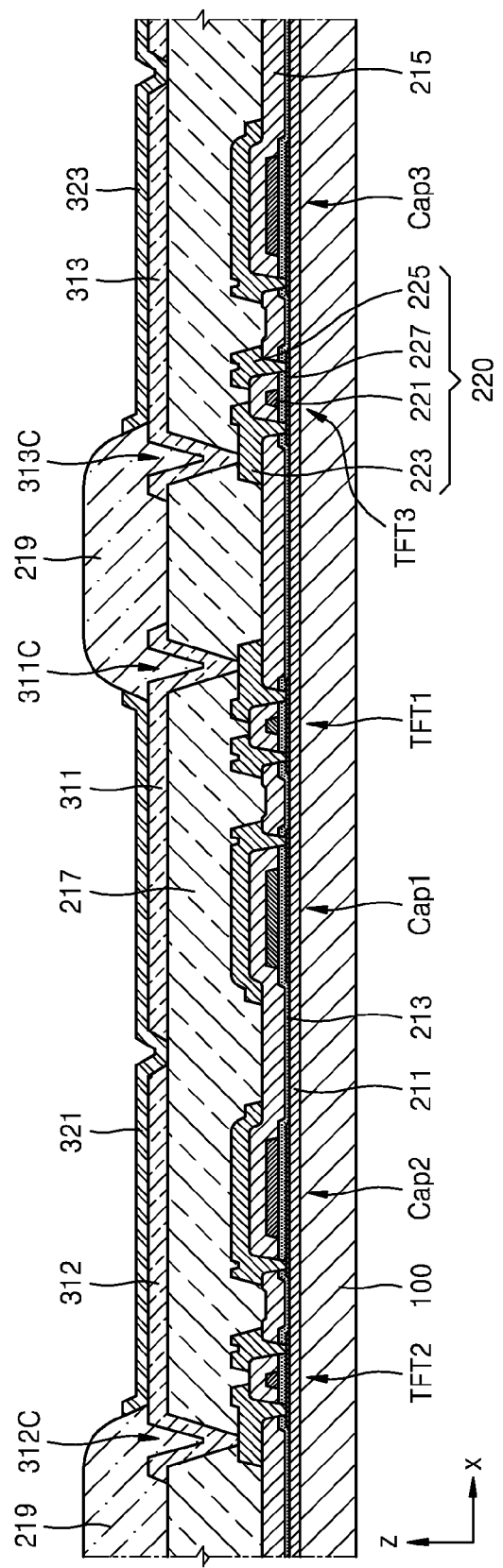
FIG. 1 is a schematic cross-sectional view of a part of an organic light-emitting display apparatus according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

An exemplary embodiment is described herein with reference to a sectional illustration that is a schematic illustration of an idealized exemplary embodiment. As such, variations from the shapes of the illustration as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
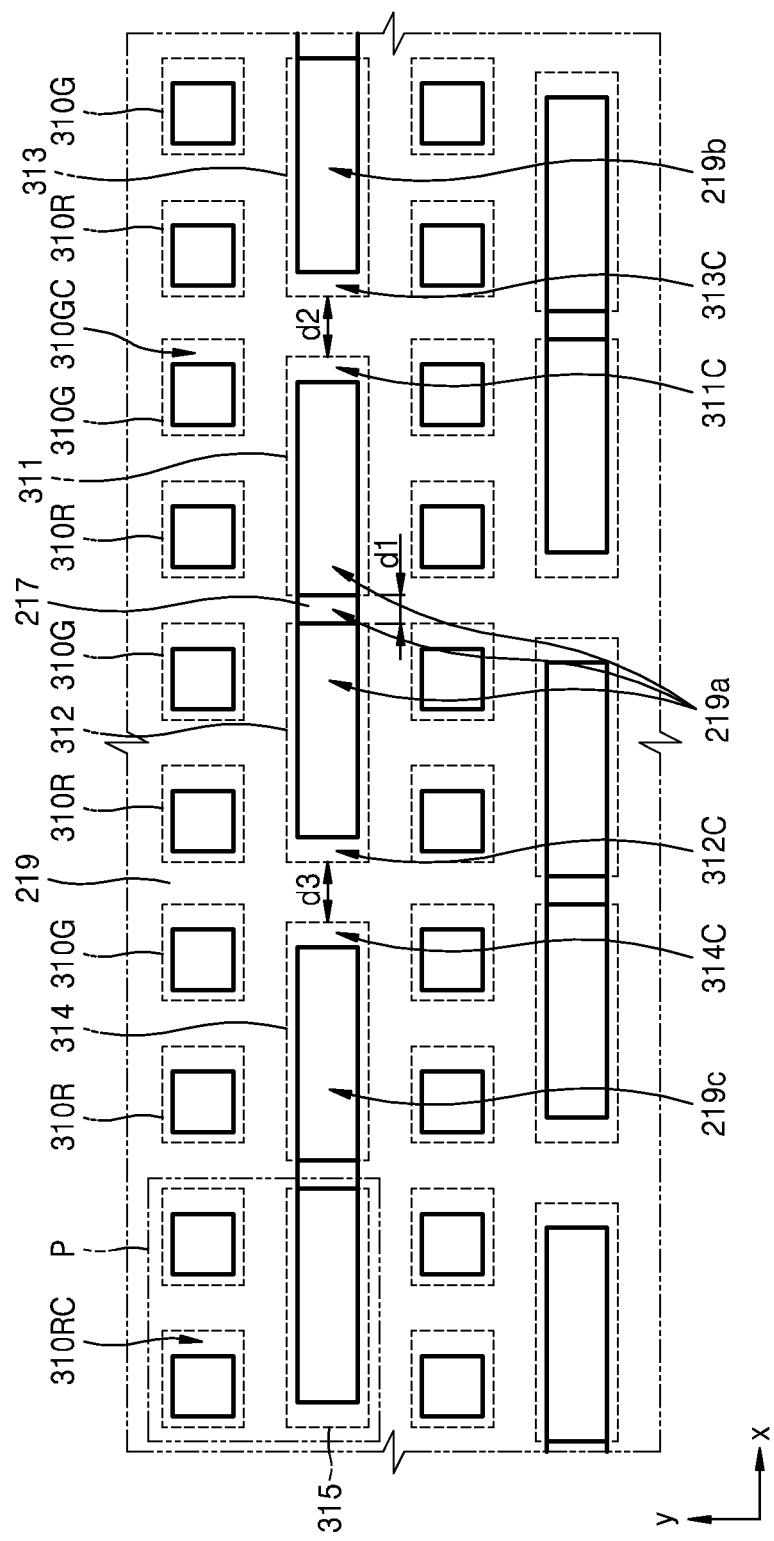
FIG. 2 is a plan view of a part of the organic light-emitting display apparatus of FIG. 1.

FIG. 1 is a schematic cross-sectional view of a part of an organic light-emitting display apparatus according to an exemplary embodiment, and FIG. 2 is a schematic plan view of a part of the organic light-emitting display apparatus of FIG. 1.

The organic light-emitting display apparatus according to the exemplary embodiment includes a substrate 100, a thin film transistor 220, a buffer layer 211, a gate insulating layer 213, an interlayer insulating layer 215, and a protective layer or a planarization layer 217. In addition to the above elements, as shown in FIG. 1 and FIG. 2, the organic light-emitting display apparatus may further include a first pixel electrode 311, a second pixel electrode 312, a third pixel electrode 313, an emission layer 321, an emission layer 323, a pixel-defining layer 219, and an opposite electrode (not shown) that are disposed on the protective layer or the planarization layer 217.

The substrate 100 may be a flexible substrate formed of plastic. If the substrate 100 includes a plastic material, it may be comparably easier for moisture and/or oxygen to permeate through the plastic substrate, compared to a glass substrate, and thus, an organic light-emitting diode including a substrate 100 made of plastic material may be more vulnerable to moisture and/or oxygen, and the lifespan of the organic light-emitting diode may be reduced. Therefore, in order to prevent or reduce the above deficiencies, the buffer layer 211 may be disposed as a single layer or multiple layers including silicon oxide or silicon nitride on the substrate 100. The substrate 100 may be formed of metal or glass, in addition to or instead of the plastic material.

The thin film transistor 220 disposed on the buffer layer 211 may include a gate electrode 221, a source electrode 223, a drain electrode 225, a semiconductor layer 227, the gate insulating layer 213, and the interlayer insulating layer 215. Referring to FIG. 1, the thin film transistor 220 may have a structure where the semiconductor layer 227 is disposed on the buffer layer 211, the gate electrode 221 is disposed on the semiconductor layer 227, and the source electrode 223 and the drain electrode 225 are disposed on the semiconductor layer 227 and the gate electrode 221, but the exemplary embodiments are not limited thereto, and may have different structures. The semiconductor layer 227 may include poly-silicon, amorphous silicon, an organic semiconductor layer, and a conductive semiconductor oxide layer.

The gate electrode 221 is disposed to correspond to the semiconductor layer 227, and an electric signal may be transferred between the source electrode 223 and the drain electrode 225 according to a signal applied to the gate electrode 221. Here, in order to insulate the semiconductor layer 227 from the gate electrode 221, the gate insulating layer 213 formed of silicon oxide and/or silicon nitride is disposed between the semiconductor layer 227 and the gate electrode 221.

The interlayer insulating layer 215 is disposed on the gate electrode 221, and the interlayer insulating layer 215 may be formed to have a single-layered structure or a multi-layered structure including silicon oxide and/or silicon nitride. However, the exemplary embodiments are not limited thereto, and various materials may be used to form the interlayer insulating layer 215. The source electrode 223 and the drain electrode 225 are disposed on the interlayer insulating layer 215. The source electrode 223 and the drain electrode 225 may be electrically connected to the semiconductor layer 227 via contact holes formed in the interlayer insulating layer 215 and the gate insulating layer 213.

The protective layer or the planarization layer 217 is disposed on the source electrode 223 and the drain electrode 225 to protect or planarize the thin film transistor disposed under the protective layer or the planarization layer 217. The protective layer or the planarization layer 217 may be configured in various shapes, and may be formed of an organic material such as benzocyclobutene (BCB) and acryl, and/or an inorganic material such as silicon oxide and silicon nitride. The protective layer or the planarization layer 217 may be variously modified, for example, may be formed to have a single layer structure, double-layer, or multi-layer structure.

The first pixel electrode 311 and the second pixel electrode 312 are disposed separated from each other, and directly on the protective layer or the planarization layer 217. The first pixel electrode 311 and the second pixel electrode 312 function as anodes, and the opposite electrode that will be described later functions as a cathode. Polarities of the first and second electrodes 311 and 312 and the opposite electrode may be inverted.

The first pixel electrode 311 and the second pixel electrode 312 may be transparent electrodes or reflective electrodes. When the first and second pixel electrodes 311 and 312 are transparent electrodes, the first and second pixel electrodes 311 and 312 may be formed of at least one of indium tin oxide (ITO), indium zinc oxide (IZO), ZnO, and $In_2O_3$. When the first and second pixel electrodes 311 and 312 are reflective electrodes, the first and second pixel electrodes 311 and 312 may include a reflective layer formed of at least one of Ag, Mg, Al, Pt, Pd, Au, Ni, Nd, Ir, Cr, and a compound thereof, and a layer formed of at least one of ITO, IZO, ZnO, and $In_2O_3$ on the reflective layer.

The pixel-defining layer 219 partially covers the first pixel electrode 311 and the second pixel electrode 312 except a center portion of the first pixel electrode 311, a center portion of the second pixel electrode 312, a first edge of the first pixel electrode 311 in a direction (in −x direction) to the second pixel electrode 312, and a second edge of the second pixel electrode 312 in a direction (in +x direction) to the first pixel electrode 311. In more detail, the pixel-defining layer 219 includes first openings 219a that are formed in an integral shape. The first openings 219a expose a center portion of the first pixel electrode 311, a first edge of the first pixel electrode 311 toward the second pixel electrode 312 (disposed in −x direction), a center portion of the second pixel electrode 312, and a second edge of the second pixel electrode 312 toward the first pixel electrode 311 (disposed in +x direction). That is, as shown in FIG. 1 and FIG. 2, rest of edges of the first pixel electrode 311 except for the first edge (which is disposed in the −x direction) are covered by the pixel-defining layer 219, and rest of edges of the second pixel electrode 312 except for the second edge (which is disposed in the +x direction) are covered by the pixel-defining layer 219. Accordingly, the protective layer or the planarization layer 217 disposed under the first and second pixel electrodes 311 and 312 is not covered by the pixel-defining layer 219 between the first pixel electrode 311 and the second pixel electrode 312. Here, referring to FIG. 2, the first edge of the first pixel electrode 311 (disposed in the −x direction) may be referred to as an edge of four sides of the first pixel electrode 311 on an XY plane disposed adjacent to a center portion of the first openings 219a facing the second pixel electrode 312 (in −x direction). Also, the second edge of the second pixel electrode 312 (disposed in the +x direction) may be referred to as an edge of four sides of the second pixel electrode 312 on the XY plane disposed adjacent to a center portion of the first openings 219a facing the first pixel electrode 311 (in +x direction).

Additional pixel electrodes such as a pixel electrode 310R and a pixel electrode 310G may be disposed on the protective layer or the planarization layer 217. For example, the pixel electrode 310R may be a pixel electrode of a red sub-pixel, and the pixel electrode 310G may be a pixel electrode of a green sub-pixel. In this case, the first pixel electrode 311 and the second pixel electrode 312 may be pixel electrodes of blue sub-pixels. Referring to FIG. 2, one red sub-pixel, one green sub-pixel, and one blue sub-pixel may configure one pixel P, but the exemplary embodiments are not limited thereto. That is, the pixel P may include various sub-pixels, and wavelengths of light emitted from the sub-pixels are not limited to red, green, and/or blue light.

In order to realize a full-color organic light-emitting display apparatus, each pixel P may include, for example, a red sub-pixel, a green sub-pixel, and a blue sub-pixel. Here, if the brightness of light emitted from one sub-pixel is relatively lower than those of the other sub-pixels, a light emission area of the sub-pixel having relatively lower light emission may be increased to improve the total brightness of the organic light-emitting display apparatus. However, an area that each sub-pixel may occupy, which corresponds to an area that a pixel electrode of each sub-pixel may occupy, is limited to the area of the pixel.

The organic light-emitting display apparatus according to the exemplary embodiments includes a certain portion of the first pixel electrode 311 and a certain portion of the second pixel electrode 312 that are not covered by the pixel-defining layer 219, and thus, the light emission area may be increased without increasing the area of the first and second pixel electrodes 311 and 312.

In more detail, as shown in FIG. 2, edges of the additional pixel electrodes, including the pixel electrode 310R and the pixel electrode 310G, are covered by the pixel-defining layer 219. Accordingly, only the center portions of the pixel electrode 310R and the pixel electrode 310G, which are not covered by the pixel-defining layer 219, are exposed, not the whole pixel electrode 310R and the whole pixel electrode 310G, which are denoted by dashed lines in FIG. 2. Accordingly, only the exposed portion of the pixel electrode 310R, not the entire pixel electrode 310R, becomes the emission area of the sub-pixel, and only the exposed portion of the pixel electrode 310G, not the entire portion of the pixel electrode 310G, becomes the emission area of the sub-pixel. However, if a red emission material and/or a green emission material have a high light-emitting efficiency, red light or green light may have sufficient brightness even if the emission area of the red sub-pixel and/or the green sub-pixel are reduced.

The first edge of the first pixel electrode 311 and the second edge of the second pixel electrode 312, which are disposed facing each other, are not covered by the pixel-defining layer 219. Accordingly, only the portions of the first and second pixel electrodes 311 and 312, which are not covered by the pixel-defining layer 219, are exposed, not the entire first and second pixel electrodes 311 and 312, which are denoted by dashed lines in FIG. 2, but the first edge of the first pixel electrode 311 and the second edge of the second pixel electrode 312 are also exposed in addition to the center portions of the first and second pixel electrodes 311 and 312. Therefore, the emission area of the sub-pixel including the first pixel electrode 311 and the emission area of the sub-pixel including the second pixel electrode 312 may be increased. For example, if a blue emission material has low light-emitting efficiency, two adjacent blue sub-pixels may respectively be formed to include the first and second pixel electrodes 311 and 312, and thus, the blue sub-pixel may emit the blue light having sufficient or increased brightness.

The emission layer 321 disposed on the first pixel electrode 311 and the second pixel electrode 312 may be formed integrally to correspond to both of the first and second pixel electrodes 311 and 312 as shown in FIG. 1. The emission layer 321 may also include separate emission layers respectively formed on the first pixel electrode 311 and the second pixel electrode 312. Referring to FIG. 1, the organic light-emitting display apparatus may include a hole injection layer or a hole transport layer (not shown) disposed commonly with respect to a plurality of pixel electrodes, and the emission layer 321 (including the pixel electrode 310R and the pixel electrode 310G) may be disposed on the hole injection layer or the hole transport layer (not shown). In addition, an electron transport layer or an electron injection layer (not shown) that is commonly formed with respect to the plurality of pixel electrodes (including the pixel electrode 310R and the pixel electrode 310G) may be further disposed on the emission layer 321.

An opposite electrode (not shown) is located on the layers including the emission layer 321. The opposite electrode is formed as an electrode commonly corresponding to the plurality of pixel electrodes (including the pixel electrode 310R and the pixel electrode 310G), and may be a transparent electrode or a reflective electrode. When the opposite electrode (not shown) is a transparent electrode, the opposite electrode (not shown) may include a layer including at least one of Li, Ca, LiF/Ca, LiF/Al, Al, Mg, and a compound thereof, and an auxiliary electrode or a bus electrode line (not shown) formed of a transparent electrode-forming material such as ITO, IZO, ZnO, and $In_2O_3$. When the opposite electrode (not shown) is a reflective electrode, the opposite electrode (not shown) may include at least one of Li, Ca, LiF/Ca, LiF/Al, Al, Mg, and a compound thereof.

A first thin film transistor TFT1 is disposed under the first pixel electrode 311 to be electrically connected to the first pixel electrode 311, and a second thin film transistor TFT2 is disposed under the second pixel electrode 312 to be electrically connected to the second pixel electrode 312. A first capacitor Cap1 electrically connected to the first thin film transistor TFT1, and/or a second capacitor Cap2 electrically connected to the second thin film transistor TFT2 may be formed. The protective layer or the planarization layer 217 that is an insulating layer may be disposed covering the first thin film transistor TFT1 and the second thin film transistor TFT2.

The first pixel electrode 311 is electrically connected to the first thin film transistor TFT1 and the second pixel electrode 312 is electrically connected to the second thin film transistor TFT2 via contact holes formed in the protective layer or the planarization layer 217. Referring to FIG. 1 and FIG. 2, a first connecting portion 311C of the first pixel electrode 311, which is electrically connected to the first thin film transistor TFT1, and a second connecting portion 312C of the second pixel electrode 312, which is electrically connected to the second thin film transistor TFT2, may be covered by the pixel-defining layer 219.

The emission layer 321 is disposed on the portions of the first pixel electrode 311 and the second pixel electrode 312, which are not covered by the pixel-defining layer 219. If the first connecting portion 311C of the first pixel electrode 311, which is electrically connected to the first thin film transistor TFT1, and the second connecting portion 312C of the second pixel electrode 312, which is electrically connected to the second thin film transistor TFT2, are covered by the pixel-defining layer 219, then the emission layer 321 may also be disposed on the first and second connecting portions 311C and 312C, and therefore, the emission layer 321 may be disposed on surface that is not flat or uniform, and thus, brightness may vary depending on locations in the sub-pixels.

In the organic light-emitting display apparatus according to the exemplary embodiment, the first connecting portion 311C of the first pixel electrode 311, which is electrically connected to the first thin film transistor TFT1, and the second connecting portion 312C of the second pixel electrode 312, which is electrically connected to the second thin film transistor TFT2, are covered by the pixel-defining layer 219. As such, the emission layer 321 is not disposed on the first and second connecting portions 311C and 312C, and therefore, the emission layer 321 may be disposed on surface that is flat and uniform, and thus, an organic light-emitting display apparatus may have relatively higher quality. The emission layer 321 may be partially disposed on the pixel-defining layer 219, as shown in FIG. 1.

The first edge of the first pixel electrode 311 and the second edge of the second pixel electrode 312, which are disposed facing each other, are not covered by the pixel-defining layer 219. Therefore, the first connecting portion 311C may be located in an edge of the first pixel electrode 311 disposed opposite to the first edge, away from the second pixel electrode 312 (+x direction), and the second connecting portion 312C may be located in an edge of the second pixel electrode 312 disposed opposite to the second edge, away from the first pixel electrode 311 (−x direction). In other words, the first connecting portion 311C may be disposed in the portion of the first pixel electrode 311 away from the second pixel electrode 312, and the second connecting portion 312C may be disposed in the portion of the second pixel electrode 312 away from the first pixel electrode 311.

Referring to FIG. 2, the organic light-emitting display apparatus may include the third pixel electrode 313 that may be disposed separate from the first pixel electrode 311 disposed at a side opposite to the second pixel electrode 312 (in +x direction). In addition, a fourth pixel electrode 314 may be disposed separate from the second pixel electrode 312 disposed at a side opposite to the first pixel electrode 311 (in −x direction). In this case, the pixel-defining layer 219 may cover a part of the third pixel electrode 313 and a part of the fourth pixel electrode 314 except a center portion of the third pixel electrode 313 and a center portion of the fourth pixel electrode 314. This can be understood that the pixel-defining layer 219 may have a second opening 219b and a third opening 219c, wherein the second opening 219b exposes a center portion of the third pixel electrode 313 and the third opening 219c exposes a center portion of the fourth pixel electrode 314.

Referring to FIG. 2, the third opening 219c may expose a center portion of a fifth pixel electrode 315 disposed facing the fourth pixel electrode 314, away from the second pixel electrode 312 (in −x direction), and edges of the fourth pixel electrode 314 and the fifth pixel electrode 315 that are facing each other, in addition to the center portion of the fourth pixel electrode 314. Referring to FIG. 2, the second opening 219b may also expose an edge of the third pixel electrode 313, which is opposite to the first pixel electrode 311 (+x direction), in addition to the center portion of the third pixel electrode 313. Although not shown in FIG. 2, the second opening 219b may also expose a center portion of another pixel electrode disposed at a side of the third pixel electrode 313 away from the first pixel electrode 311 (+x direction), and an edge of the pixel electrode facing the third pixel electrode 313. The pixel-defining layer 219 also covers a third edge of the third pixel electrode 313 facing the first pixel electrode 311 and a fourth edge of the fourth pixel electrode 314 facing the second pixel electrode 312.

A first distance d1 defines the distance between the first pixel electrode 311 and the second pixel electrode 312. A second distance d2 between the first pixel electrode 311 and the third pixel electrode 313 and a third distance d3 between the second pixel electrode 312 and the fourth pixel electrode 314 may be greater than the first distance d1 between the first pixel electrode 311 and the second pixel electrode 312.

The emission layer 321 may be formed integrally on the first pixel electrode 311 and on the second pixel electrode 312. Therefore, when a deposition method using a mask is performed in order to form the emission layer 321, an opening of the mask may have a shape corresponding to that of the first opening 219a of the pixel-defining layer 219. The emission layer is not formed commonly for the first pixel electrode 311 and the third pixel electrode 313. Therefore, when a deposition method using a mask is performed in order to form the emission layer, the mask may have a rib corresponding to a space between the first pixel electrode 311 and the third pixel electrode 313, such as to prevent or reduce deformation of the openings in the mask.

Since the emission layer is not formed on a portion corresponding to the rib of the mask, the second distance d2 between the first pixel electrode 311 and the third pixel electrode 313 and the third distance d3 between the second pixel electrode 312 and the fourth pixel electrode 314 may be increased. Therefore, the second distance d2 and the third distance d3 may be formed to be greater than the first distance d1, and thus, the mask may include ribs such that deformation of the shapes of the openings in the masks that are used to form the emission layers 321 and 323 may be reduced. Referring to FIG. 2, portions between the pixel electrodes that do not share the emission layer may be located in zigs-zags on the display area so that the mask may have the ribs in zigs-zags, and a structure of the mask may have increased firmness.

In addition, like the first connecting portions 311C of the first pixel electrode 311 and the second connecting portion 312C of the second pixel electrode 312, a third connecting portion 313C of the third pixel electrode 313, which is electrically connected to a third thin film transistor TFT3, and a fourth connecting portion 314C of the fourth pixel electrode 314, which is electrically connected to the fourth thin film transistor (not shown), may be covered by the pixel-defining layer 219. As such, the emission layer disposed on the third pixel electrode 313 or the fourth pixel electrode 314 may be disposed on a flat or uniform structure, and accordingly, an organic light-emitting display apparatus may have relatively higher quality. Referring to FIG. 1, the third pixel electrode 313 may be electrically connected to a third capacitor Cap3, in addition to the third thin film transistor TFT3, and may be variously modified.

The first, second, third, and fourth connecting portions 311C, 312C, 313C, and 314C may be disposed corresponding to the ribs of the mask that is used to form the emission layers 321 and 323. That is, the first connecting portion 311C is disposed in the first pixel electrode 311, away from the second pixel electrode 312 (+x direction), the second connecting portion 312C is disposed in a portion of the second pixel electrode 312, away from the first pixel electrode 311 (−x direction), the third connecting portion 313C is disposed at a portion of the third pixel electrode 313 facing the first pixel electrode 311 (−x direction), and the fourth connecting portion 314C is disposed at a portion of the fourth pixel electrode 314 facing the second pixel electrode 312. The connecting portions 311C, 312C, 313C, and 314C are disposed where the ribs of the mask that is used to form the emission layer 321 or the emission layer 323 will be located, and thus, the emission areas may be disposed spaced apart from each other. Therefore, the first to fourth connecting portions 311C, 312C, 313C, and 314C may be disposed without reducing the areas of the emission areas.

FIG. 3 is a schematic plan view of a part of an organic light-emitting display apparatus according to an exemplary embodiment. The organic light-emitting display apparatus according to the exemplary embodiment includes a plurality of pixel electrodes that are arranged in series along an x-axis separate from each other. In addition, the pixel-defining layer 219 covers parts of the plurality of pixel electrodes except center portions of the plurality of pixel electrodes and edges between adjacent ones of the plurality of pixel electrodes. This can be understood that the pixel-defining layer 219 may include an opening 219a that is integrally formed, and the opening 219a exposes center portions of the plurality of pixel electrodes 311 and edges of the plurality of the pixel electrodes 311, which are disposed between adjacent ones of the plurality of the pixel electrodes 311.

The additional pixel electrodes such as the pixel electrode 310R and the pixel electrode 310G may be disposed on the protective layer or the planarization layer 217. For example, the pixel electrode 310R may be considered as a pixel electrode of a red sub-pixel, and the pixel electrode 310G may be considered as a pixel electrode of a green sub-pixel. In this case, the plurality of pixel electrodes 311 may be pixel electrodes of blue sub-pixels. Referring to FIG. 3, one red sub-pixel, one green sub-pixel, and one blue sub-pixel may configure one pixel P, but the exemplary embodiments are not limited thereto. That is, the pixel P may include various sub-pixels, and wavelengths of light emitted from the sub-pixels are not limited to red, green, and/or blue light.

In order to form a full-color organic light-emitting display apparatus, each pixel P may include, for example, a red sub-pixel, a green sub-pixel, and a blue sub-pixel. Here, if a brightness of light emitted from a certain sub-pixel is relatively lower than those of other sub-pixels, a light emission area of the sub-pixel having relatively lower light emission may be increased to improve brightness of the entire organic light-emitting display apparatus. However, an area that each sub-pixels may occupy, which corresponds to an area that a pixel electrode of each sub-pixel may occupy, is limited to the area of the pixel.

The organic light-emitting display apparatus according to the present exemplary embodiments includes the edges of the plurality of pixel electrodes 311 disposed between adjacent ones of the plurality of the pixel electrodes 311, as well as the center portions of the plurality of pixel electrodes 311, are not covered by the pixel-defining layer 219, and thus, the emission area may be increased without increasing an area of each of the plurality of pixel electrodes 311.

In more detail, as shown in FIG. 3, all of the edges of the additional pixel electrode, including the pixel electrode 310R or the pixel electrode 310G, are covered by the pixel-defining layer 219. Accordingly, only the center portions of the pixel electrode 310R or the pixel electrode 310G, which are not covered by the pixel-defining layer 219, are exposed, not the entire pixel electrode 310R or the entire pixel electrode 310G, which are denoted by dashed lines in FIG. 3. Therefore, only the exposed portion, not the entire pixel electrode 310R, becomes the emission area of the sub-pixel, and only the exposed portion, not the entire pixel electrode 310G, becomes the emission area of the sub-pixel. However, if a red emission material and/or a green emission material have high light-emitting efficiency, red light or green light may have sufficient brightness even though the emission area of the red sub-pixel and/or the green sub-pixel is reduced.

However, the edges of the plurality of pixel electrodes 311 disposed between the adjacent ones of the plurality of the pixel electrode 311, as well as the center portions of the plurality of pixel electrodes 311, are not covered by the pixel-defining layer 219. Accordingly, only the portions that are not covered by the pixel-defining layer 219, not the entire pixel electrodes 311 denoted by dashed lines in FIG. 3, are exposed, the emission area in each of the sub-pixels including the plurality of pixel electrodes 311 may be increased. For example, if the light-emitting efficiency of a blue emission material is low, the blue sub-pixels may be formed to have the plurality of pixel electrodes 311 so that the blue sub-pixels may emit the blue light having sufficient or increased brightness.

The emission layer disposed on the plurality of pixel electrodes 311 may be formed as one body to correspond to the plurality of pixel electrodes. The emission layers may also include separate emission layer on the plurality of pixel electrodes 311.

Among the plurality of pixel electrodes 311 arranged in a row along the x-axis, an edge (in the −x direction) of the last pixel electrode 311 located at one end in the −x direction and an edge (in the +x direction) of the last pixel electrode 311 located at the other end (in the +x direction) are covered by the pixel-defining layer 219. Two edges in each of the plurality of pixel electrodes 311 arranged extending in parallel with an axis (x axis) extending from the one end to the other end of the pixel electrode, are also covered by the pixel-defining layer 219.

A plurality of thin film transistors are electrically connected to the plurality of pixel electrodes 311, and the plurality of thin film transistors are covered by the protective layer or the planarization layer 217 that is an insulating layer. The plurality of pixel electrodes 311 are on the protective layer or the planarization layer 217. Connecting portions 311C, through which the plurality of pixel electrodes 311 are electrically connected to the plurality of thin film transistors, are covered by the pixel-defining layer 219.

Accordingly, the emission layer is disposed corresponding to the plurality of pixel electrodes 311, which are not covered by the pixel-defining layer 219. If the connecting portions 311C through which the plurality of pixel electrodes 311 are electrically connected to the plurality of thin film transistors are not covered by the pixel-defining layer and the emission layer is disposed on the connecting portions 311C, the emission layer may be disposed on surface that is not flat or uniform, and thus, brightness may vary depending on locations in the sub-pixels.

In the organic light-emitting display apparatus according to the present exemplary embodiment, the connecting portions 311C, through which the plurality of pixel electrodes 311 are electrically connected to the plurality of thin film transistors, are covered by the pixel-defining layer 219. As such, the emission layer 321 is not disposed on the connecting portions 311C, and therefore, the emission layer may be disposed on surface that is flat or uniform, and accordingly, the organic light-emitting display apparatus may have high quality. In this case, the connecting portions 311C through which the plurality of pixel electrodes 311 are electrically connected to the plurality of thin film transistors 311 may be located at edges of the plurality of pixel electrodes 311 that are disposed in a second direction (+z direction or −z direction) perpendicular to the axis (x-axis) extending from an end to the other end of the plurality of pixel electrodes 311.

According to the one or more exemplary embodiments, the organic light-emitting display apparatus capable of displaying images precisely while improving brightness may be obtained.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light-emitting display apparatus comprising:
   a first pixel electrode and a second pixel electrode that are disposed spaced apart adjacent to each other;
   a pixel-defining layer disposed on the first pixel electrode and the second pixel electrode, the pixel-defining layer covering a part of the first pixel electrode and a part of the second pixel electrode except a center portion of the first pixel electrode, a center portion of the second pixel electrode, a first edge of the first pixel electrode in a direction to the second pixel electrode, and a second edge of the second pixel electrode in a direction to the first pixel electrode;
   a first thin film transistor disposed under the first pixel electrode, the first thin film transistor electrically connected to the first pixel electrode at a first connecting portion of the first pixel electrode; and
   a second thin film transistor disposed under the second pixel electrode, the second thin film transistor electrically connected to the second pixel electrode at a second connecting portion of the second pixel electrode,
   wherein the first connecting portion is disposed corresponding to an edge of the first pixel electrode disposed opposite to the first edge, away from the second pixel electrode, and
   wherein the second connecting portion is disposed corresponding to an edge of the second pixel electrode disposed opposite to the second edge, away from the first pixel electrode.

2. The organic light-emitting display apparatus of claim 1, further comprising an emission layer disposed integrally on the first pixel electrode and the second pixel electrode.

3. The organic light-emitting display apparatus of claim 1, wherein, the pixel-defining layer covers edges of the first pixel electrode except the first edge, and covers edges of the second pixel electrode except the second edge.

4. The organic light-emitting display apparatus of claim 1, further comprising:
   an insulating layer covering the first thin film transistor and the second thin film transistor,
   wherein the first pixel electrode and the second pixel electrode are disposed on the insulating layer, and
   wherein the pixel-defining layer covers the first connecting portion of the first pixel electrode and the second connecting portion of the second pixel electrode.

5. The organic light-emitting display apparatus of claim 1, further comprising:
   a third pixel electrode disposed spaced apart from the first pixel electrode, such that the first pixel electrode is disposed between the third pixel electrode and the second pixel electrode; and
   a fourth pixel electrode disposed spaced apart from the second pixel electrode, such that the second pixel electrode is disposed between the fourth pixel electrode and the first pixel electrode,
   wherein the pixel-defining layer covers a part of the third pixel electrode and a part of the fourth pixel electrode except a center portion of the third pixel electrode and a center portion of the fourth pixel electrode, wherein a second distance between the first pixel electrode and the third pixel electrode and a third distance between the second pixel electrode and the fourth pixel electrode are both greater than a first distance between the first pixel electrode and the second pixel electrode.

6. The organic light-emitting display apparatus of claim 1, further comprising: an additional pixel electrode disposed separate from the first pixel electrode and the second pixel electrode, wherein the pixel-defining layer covers the additional pixel electrode except a center portion of the additional pixel electrode, the pixel-defining layer covering all edges of the additional pixel electrode.

7. An organic light-emitting display apparatus comprising:

a first pixel electrode and a second pixel electrode that are disposed spaced apart adjacent to each other;

a third pixel electrode disposed spaced apart from the first pixel electrode, such that the first pixel electrode is disposed between the third pixel electrode and the second pixel electrode;

a fourth pixel electrode disposed spaced apart from the second pixel electrode, such that the second pixel electrode is disposed between the fourth pixel electrode and the first pixel electrode; and a pixel-defining layer disposed on the first pixel electrode and the second pixel electrode, the pixel-defining layer covering a part of the first pixel electrode and a part of the second pixel electrode except a center portion of the first pixel electrode, a center portion of the second pixel electrode, a first edge of the first pixel electrode in a direction to the second pixel electrode, and a second edge of the second pixel electrode in a direction to the first pixel electrode, wherein a second distance between the first pixel electrode and the third pixel electrode and a third distance between the second pixel electrode and the fourth pixel electrode are both greater than a first distance between the first pixel electrode and the second pixel electrode, wherein the pixel-defining layer covers a third edge of the third pixel electrode facing the first pixel electrode, and wherein the pixel defining layer covers a fourth edge of the fourth pixel electrode facing the second pixel electrode.

8. The organic light-emitting display apparatus of claim 7, further comprising:

a first thin film transistor disposed under the first pixel electrode, the first thin film transistor electrically connected to the first pixel electrode at a first connecting portion of the first pixel electrode;

a second thin film transistor disposed under the second pixel electrode, the second thin film transistor electrically connected to the second pixel electrode at a second connecting portion of the second pixel electrode;

a third thin film transistor disposed under the third pixel electrode, the third thin film transistor electrically connected to the third pixel electrode at a third connecting portion of the third pixel electrode;

a fourth thin film transistor disposed under the fourth pixel electrode, the fourth thin film transistor electrically connected to the fourth pixel electrode at a fourth connecting portion of the fourth pixel electrode; and an insulating layer covering the first thin film transistor, the second thin film transistor, the third thin film transistor, and the fourth thin film transistor, wherein the first pixel electrode, the second pixel electrode, the third film transistor, and the fourth pixel electrode are disposed on the insulating layer, and wherein the pixel-defining layer covers the first connecting portion of the first pixel electrode, the second connecting portion of the second pixel electrode, the third connecting portion of the third pixel electrode, and the fourth connecting portion of the fourth pixel electrode.

9. The organic light-emitting display apparatus of claim 8, wherein the first connecting portion is disposed corresponding to an edge of the first pixel electrode disposed opposite to the first edge away from the second pixel electrode, wherein the second connecting portion is disposed corresponding to an edge of the second pixel electrode disposed opposite to the second edge away from the first pixel electrode, wherein the third connecting portion is disposed corresponding to an edge of the third pixel electrode facing the first pixel electrode, and wherein the fourth connecting portion is disposed corresponding to an edge of the fourth pixel electrode facing the second pixel electrode.

10. An organic light-emitting display apparatus comprising:

a plurality of first pixel electrodes arranged in a first row in a first direction, each of the plurality of first pixel electrodes being disposed to be spaced apart from each other;

a plurality of second pixel electrodes and a plurality of third pixel electrodes alternatingly arranged in a second row parallel to the first row in the first direction;

a pixel-defining layer disposed on the plurality of first pixel electrodes, the pixel defining layer covering parts of the plurality of first pixel electrodes except center portions of the plurality of first pixel electrodes and edges between adjacent ones of the plurality of first pixel electrodes; and a first emission layer disposed integrally on the plurality of first pixel electrodes, the first emission layer configured to generate a first light having a first color, wherein the plurality of second pixel electrodes is configured to generate a second light having a second color, and wherein the plurality of third pixel electrodes is configured to generate a third light having a third color different from the second color.

11. The organic light-emitting display apparatus of claim 10, wherein the pixel-defining layer covers respective outer edges of two end pixel electrodes among the plurality of first pixel electrodes, wherein the two end pixel electrodes are disposed at respective end of the first row in the first direction, and wherein the respective outer edges of two end pixel electrodes are edges of the two end pixel electrodes adjacent to the respective ends in the first direction.

12. The organic light-emitting display apparatus of claim 10, wherein the pixel-defining layer covers the plurality of second pixel electrodes and the plurality of third pixel electrodes except a center portion of the plurality of second pixel electrodes and the plurality of third pixel electrodes, the pixel-defining layer covering all edges of the plurality of second pixel electrodes and the plurality of third pixel electrodes.

13. The organic light-emitting display apparatus of claim 10, wherein each of the plurality of first pixel electrodes have a first length in the first direction, wherein each of the plurality of second pixel electrodes and each of the plurality of third pixel electrodes respectively have a second length and a third length in the first direction, and wherein the first length is greater than the second length and the third length.

14. An organic light-emitting display apparatus comprising:

a plurality of pixel electrodes arranged in a row extending in a first direction, each of the plurality of pixel electrodes being disposed to be spaced apart from with each other;

a pixel-defining layer disposed on the plurality of pixel electrodes, the pixel defining layer covering parts of the plurality of pixel electrodes except center portions of the plurality of pixel electrodes and edges between adjacent ones of the plurality of pixel electrodes;

a plurality of thin film transistors disposed under the plurality of pixel electrodes, the plurality of thin film transistors being electrically connected to the plurality of pixel electrodes at connecting portions of the plurality of pixel electrodes, respectively; and an insulating layer covering the plurality of thin film transistors, wherein the plurality of pixel electrodes are disposed on the insulating layer, wherein the pixel-defining layer covers the connecting portions of the plurality of pixel electrodes, and wherein each of the connecting portions is disposed corresponding to an edge of a corresponding one of the plurality of pixel electrodes, the edge of the corresponding one of the plurality of pixel electrodes is disposed in a second direction perpendicular to the first direction from a center of the corresponding one of the plurality of pixel electrodes.

* * * * *